United States Patent [19]

Sato

[11] Patent Number: 5,867,431
[45] Date of Patent: Feb. 2, 1999

[54] MEMORY DEVICE AND METHOD OF CONTROLLING THE SAME

[75] Inventor: Yasunori Sato, Tokyo, Japan

[73] Assignee: Oki Electric Industry Co., Ltd., Tokyo, Japan

[21] Appl. No.: 899,386

[22] Filed: Jul. 23, 1997

[51] Int. Cl.⁶ ................................................. G11C 16/04
[52] U.S. Cl. .............................. 365/189.04; 365/189.07; 365/230.05
[58] Field of Search ......................... 365/189.04, 230.05, 365/189.07

[56] References Cited

U.S. PATENT DOCUMENTS 5,436,863  7/1995  Kogure .............................. 365/189.04

*Primary Examiner*—David Nelms
*Assistant Examiner*—Hoai Ho
*Attorney, Agent, or Firm*—Jones & Volentine, L.L.P.

[57] ABSTRACT

A memory device comprises a differential circuit for outputting a signal corresponding to the difference in value between an input read address signal and an input write address signal, a determination circuit for outputting a decision signal responsive to the output of the differential circuit and an address generating circuit for outputting a generated write address and a generated read address having a given or greater difference in signal value therebetween, based on the input read address signal, the input write address signal and the decision signal.

5 Claims, 5 Drawing Sheets

MEMORY DEVICE AND METHOD OF CONTROLLING THE SAME

BACKGROUND OF THE INVENTION

Field of the Invention

This invention relates to a method of controlling a multi-port memory used in a data delay circuit of a video system or the like.

Description of the Related Art

A dual-port memory (hereinafter called "two-port memory") showing one example of a conventional multi-port memory has a read decoder and a write decoder and is capable of performing a read process and a write process during the same cycle.

SUMMARY OF THE INVENTION

An object of the present invention is to avoid a problem that when a read address and a write address supplied to a memory differ in cycle from each other, data to be read is damaged due to the coincidence between the read address and the write address or read simultaneously with writing.

According to one aspect of the present invention, for achieving the above object, there is provided a memory device comprising:

a differential circuit for outputting a signal having a value corresponding to a difference in value between an input read address signal and an input write address signal;

a determination circuit for outputting a decision signal having a first level when the value of the signal outputted from said differential circuit falls within a predetermined value and outputting the decision signal having a second level when the value thereof exceeds the predetermined value;

an address generating circuit for receiving the input write address signal, the input read address signal and the decision signal therein and outputting generated write and read addresses having a difference in signal value therebetween exceeding at least the predetermined value regardless of the difference in value between the input write address signal and the input read address signal;

a write address decoder for decoding the generated write address;

a read address decoder for decoding the generated read address; and a memory for storing input data at an address corresponding to an output produced from the write address decoder and outputting output data from an address corresponding to an output produced from the read address decoder.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

A preferred embodiment of the present invention will hereinafter be described with reference to the accompanying drawings.

Figure 1:
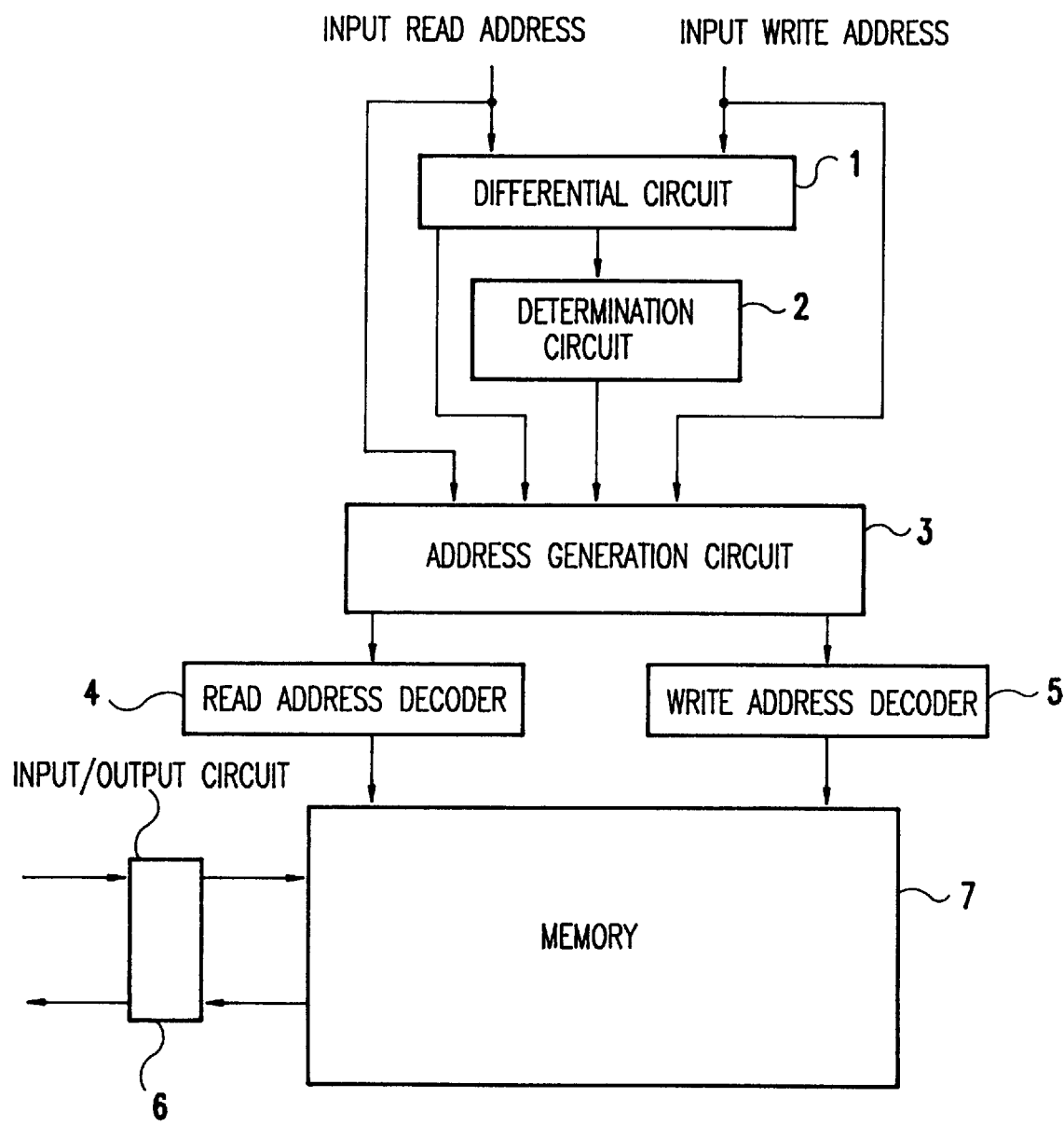
FIG. 1 is a schematic block diagram of a two-port memory showing an embodiment of the present invention.

FIG. 1 is a schematic block diagram of a two-port memory showing an embodiment of the present invention.

The two-port memory comprises a differential circuit 1, a determination circuit 2, an address generating circuit 3, a read address decoder 4, a write address decoder 5, an input/output circuit 6 and a memory or storage unit 7.

The differential circuit 1 serves as a circuit for outputting a differential signal indicative of the absolute value of a difference between an input read address and an input write address. The determination circuit 2 serves as a circuit for outputting a decision signal indicative of whether or not the value of the differential signal exceeds a predetermined value (2 in the present embodiment). Specifically described, the determination circuit 2 outputs a low-level decision signal when the value of the differential signal is larger than 2 and outputs a high-level decision signal when the value of the differential signal is smaller than or equal to 2. The address generating circuit 3 comprises a read address generating circuit and a write address generating circuit. The address generating circuit 3 serves as a circuit for outputting a generated read address and a generated write address therefrom based on the input read address, input write address, decision signal and differential signal. The input/output circuit 6 serves as a circuit for inputting data from the outside and outputting it to the memory 7 and for inputting data outputted from the memory 7 therein and outputting it to the outside. The read address decoder 4 serves as a circuit for decoding the generated read address. The write address decoder 5 is a circuit for decoding the generated write address. The memory 7 serves as a circuit for writing data outputted from the input/output circuit 6 to an address specified by the write address decoder 5 and outputting data stored at an address specified by the read address decoder 4.

Figure 2:
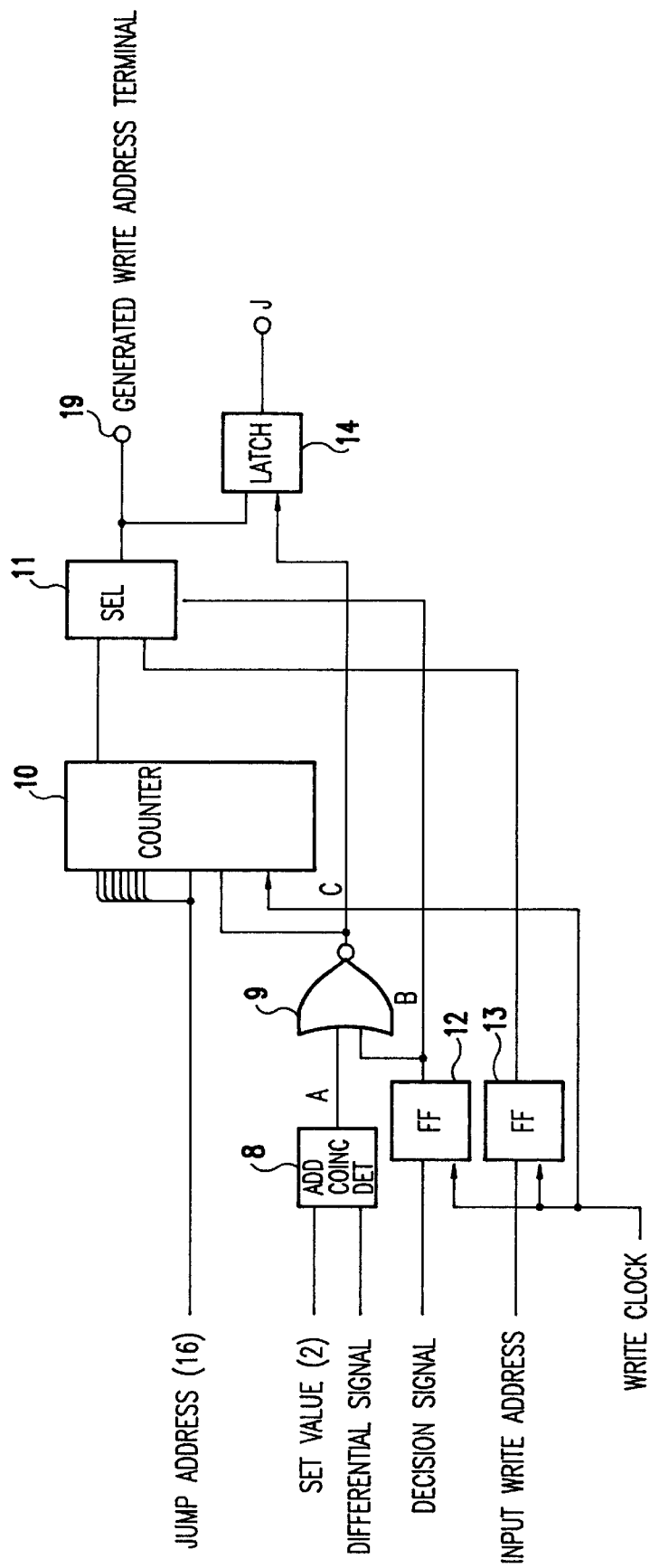
FIG. 2 is a block diagram of a write address generating circuit.

FIG. 2 is a circuit diagram of the write address generating circuit.

The write address generating circuit comprises an address coincidence detecting circuit 8, an NOR circuit 9, a counter 10, D-type flip-flops 12 and 13, a latch circuit 14 and a selector 11. The address coincidence detecting circuit 8 serves as a circuit for outputting a signal A indicative of whether the value of the differential signal coincides with the predetermined value "2". Specifically described, the address coincidence detecting circuit 8 outputs a low-level signal A when the output of the determination circuit 2 coincides with the set value "2" and outputs a high-level signal A when the output of the determination circuit 2 does not coincide with the set value "2". The D-type flip-flop 12 is a circuit for receiving a decision signal and a write clock therein and outputting a signal B obtained by delaying the decision signal by one clock of the write clock. The NOR circuit 9 serves as a circuit for performing NOT the OR of the signal A and the signal B and outputting a signal C. When the high-level signal C is inputted to the counter 10, the counter 10 outputs a predetermined jump address "16" as a counter value "16" on the rising edge of the next write clock. Subsequently, the counter 10 increments the previously-outputted counter value in response to the leading edge of the write clock and outputs the result of increment therefrom. The D-type flip-flop 13 serves as a circuit for receiving an input write address and the write clock therein and outputting a signal obtained by delaying the input write address by one clock of the write clock. The selector 11 receives the output of the counter 10 and the outputs of the D-type flip-flops 12 and 13 therein and outputting either one of the outputs of the counter 10 and the D-type flip-flop 13 as a generated write address in response to the signal B corresponding to the output of the D-type flip-flop 12. Specifically described, the selector 11 outputs the output of the D-type flip-flop 13 therefrom when a low-level signal B is inputted to the selector 11 and outputs the output of the counter 10 therefrom when a high-level signal B is inputted to the selector 11. A generated write address terminal 19 is electrically connected to the selector 11 so as to be supplied with the generated write address. The latch circuit 14 receives the generated write address and the signal C therein. When the high-level signal C is inputted to the latch circuit 14, the latch circuit 14 latches therein the generated write address inputted thereto at that time and outputs the latched generated write address as a signal J.

Figure 4:
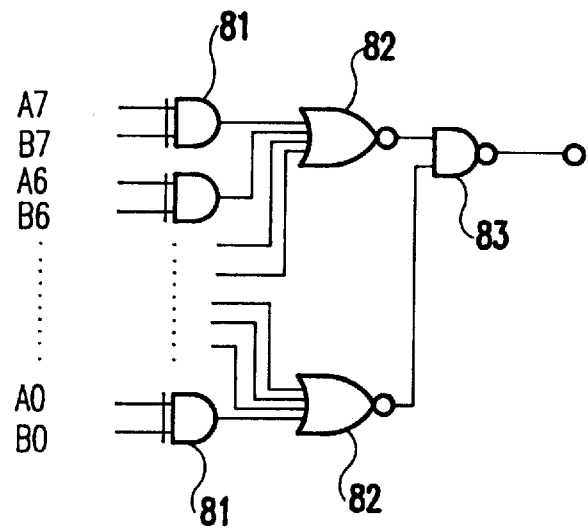
FIG. 4 is a circuit diagram of an address coincidence detecting circuit 8.

FIG. 4 is a circuit diagram showing the address coincidence detecting circuit 8.

The address coincidence detecting circuit 8 comprises eight EXOR circuits 81, two NOR circuits 82 and a NAND circuit 83. One inputs (A7, A6, A5, A4, A3, A2, A1 and A0) of the eight EXOR circuits 81 are supplied with the set value <2> as a binary notational signal as represented in the form of (00000010). On the other hand, the other inputs (B7, B6, B5, B4, B3, B2, B1 and B0) of the eight EXOR circuits 81 are supplied with the differential signal as a signal represented in binary notation.

Figure 3:
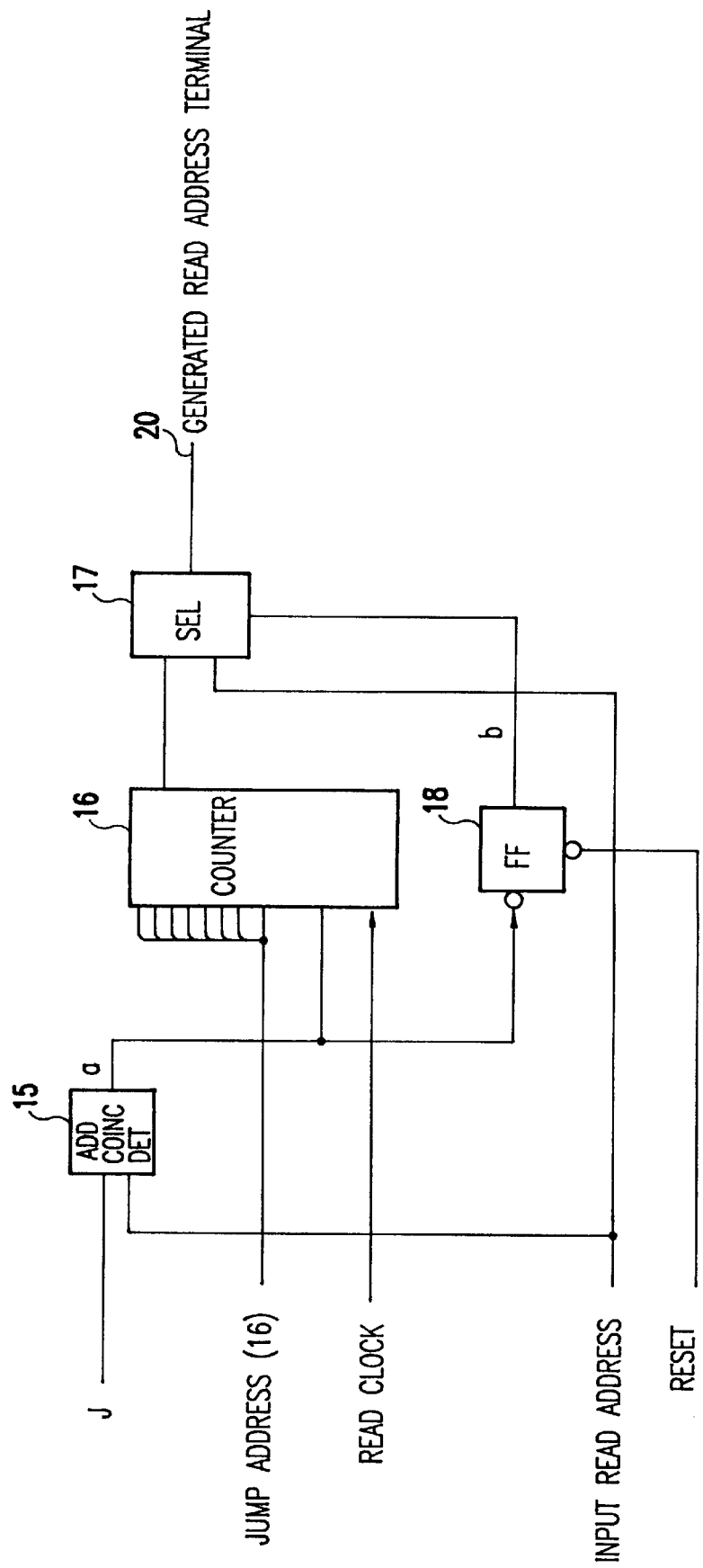
FIG. 3 is a block diagram of a read address generating circuit.

FIG. 3 is a circuit diagram showing the read address generating circuit. The read address generating circuit comprises an address coincidence detecting circuit 15, a counter 16, a selector 17 and a T-type flip-flop 18.

The address coincidence detecting circuit 15 is inputted with a signal J and an input read address. The address coincidence detecting circuit 15 serves as a circuit for outputting a low-level signal a when the value of the signal J and the input read address do not coincide with each other and outputting a high-level signal a when the value of the signal J and the input read address coincide with each other.

Figure 5:
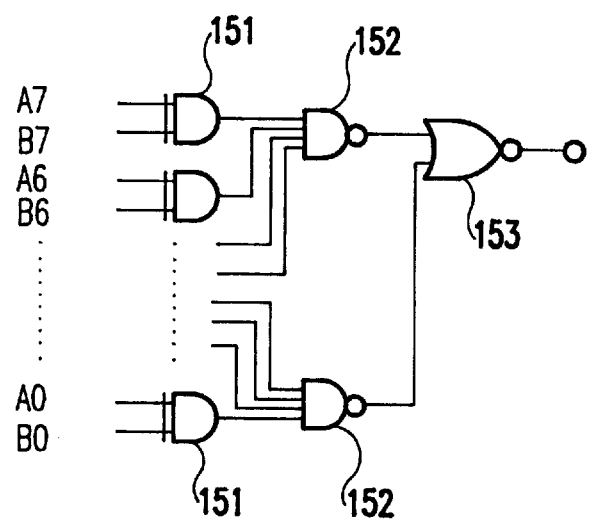
FIG. 5 is a circuit diagram of an address coincidence detecting circuit 15.

The counter 16 outputs a predetermined jump address (16 in this case) on the rising edge of the next read clock as a counter value 16 when the high-level signal a is inputted to the counter 16. Thereafter, the counter 16 increments the previously-outputted counter value in response to the leading edge of the read clock and outputs the result of increment therefrom. The T-type flip-flop 18 serves as a circuit for receiving the signal a therein and outputting a signal b therefrom. Specifically described, the T-type flip-flop 18 serves as a circuit for inverting the level of the previously-outputted signal b and outputting the level-inverted signal therefrom in response to the trailing edge of the signal a from a high level to a low level. The selector 17 receives the output of the counter 16, the signal b and the input read address therein. The selector 17 serves as a circuit for outputting either one of the input read address and the output of the counter 16 as a generated read address in response to the level of the signal b. Specifically described, the selector 17 outputs the input read address when a low-level signal b is inputted thereto and outputs the output of the counter 16 when a high-level signal b is inputted thereto. The generated read address terminal 20 is electrically connected to the selector 17 and is supplied with the generated read address FIG. 5 is a circuit diagram showing the address coincidence detecting circuit 15.

The address coincidence detecting circuit 15 comprises eight EXNOR circuits 151, two NAND circuits 152 and a NOR circuit 153. One inputs (A7, A6, A5, A4, A3, A2, A1 and A0) of the eight EXNOR circuits 151 are supplied with "J" as a signal represented in binary notation. The other inputs (B7, B6, B5, B4, B3, B2, B1 and B0) of the eight EXNOR circuits 151 are supplied with the input read address as a signal represented in binary notation.

The operation of the embodiment according to the present invention will next be described with reference to FIG. 6.

Figure 6:
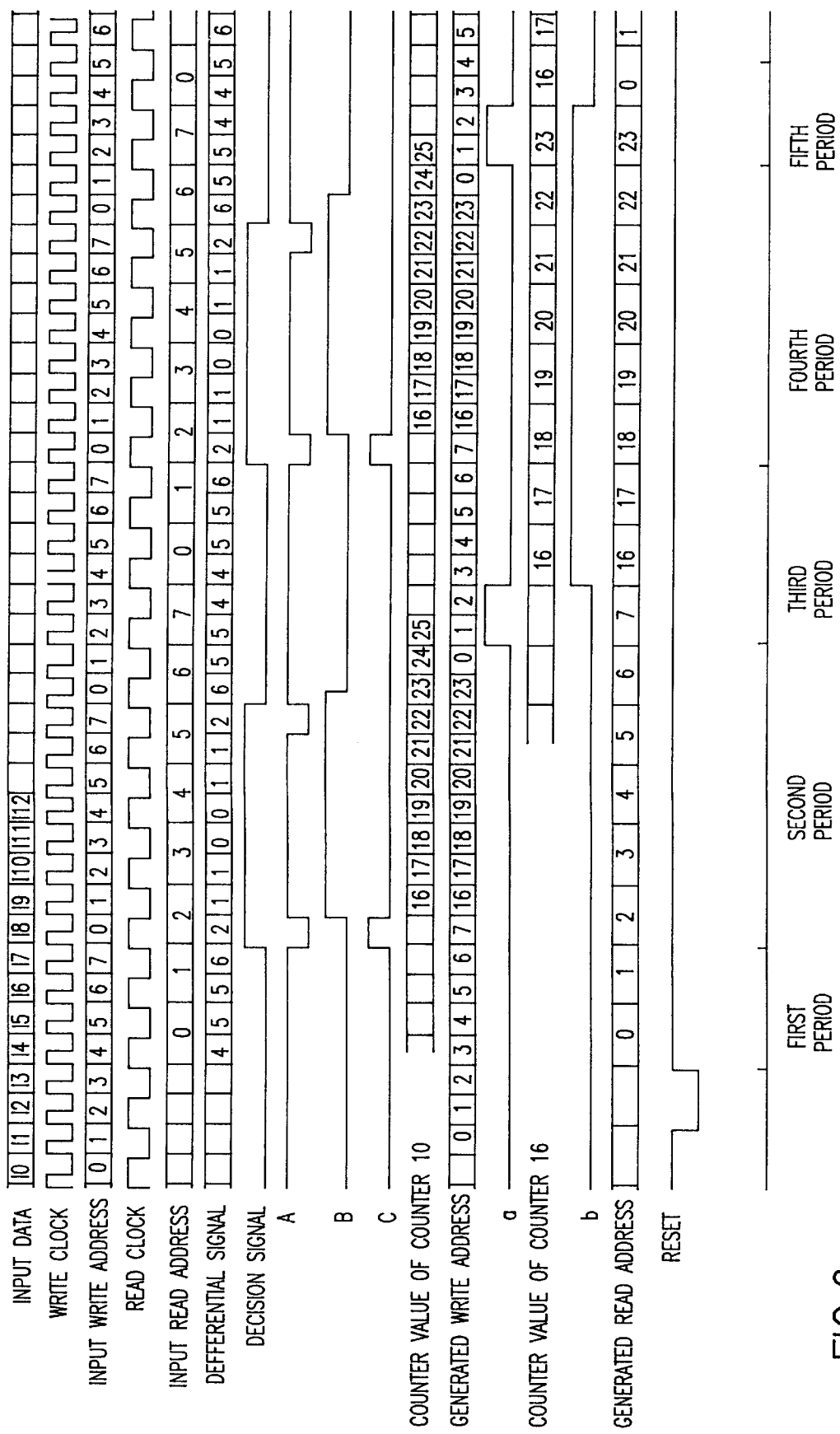
FIG. 6 is a timing chart for describing the operation of the two-port memory showing the embodiment of the present invention.

FIG. 6 is a timing chart for describing the operation of the two-port memory showing the embodiment according to the present invention.

According to the timing chart, data 10, 12, 13, . . . inputted to the two-port memory with the cycle as T are delayed and outputted in a cycle 2T corresponding to twice the cycle T. According to the timing chart as well, a write address is repeated for each cycle 8T by an unillustrated write address counter.

An operation of the two-port memory during a first period will first be described.

This period corresponds to a period during which the absolute value of the difference between an input read address and an input write address is larger than 2. The differential circuit 1 outputs a differential signal indicative of a value larger than 2. The determination circuit 2 outputs a low-level decision signal because the value of the differential signal is larger than 2. Since the D-type flip-flop 12 of the write address generating circuit outputs a low-level signal B during this period, the selector 11 outputs the output of the D-type flip-flop 13 therefrom. Namely, the address generating circuit 3 outputs a signal obtained by delaying the input write address by one clock of a write clock therefrom as a generated write address. Further, since the T-type flip-flop 18 of the read address generating circuit is reset so as to output a low-level signal b, the selector 17 outputs the input read address therefrom. Namely, the address generating circuit 3 outputs the input read address therefrom as a generated read address.

An operation of the two-port memory during a second period will next be described.

The differential circuit 1 outputs a differential signal indicative of a value smaller than or equal to 2 during an interval between inputting an input read address "2" and an input write address "0" and inputting an input read address "5" and an input write address "7". While the differential circuit 1 is outputting the differential signal indicative of the value less than or equal to 2, the determination circuit 2 outputs a high-level decision signal therefrom. When the value of the differential signal outputted from the differential circuit 1 has firstly reached "2" during the second period, the NOR circuit 9 receives a low-level signal A and a low-level signal B therein and outputs a high-level signal C therefrom. In response to the high-level signal C, the latch circuit 14 latches the generated write address "7" inputted at that time therein. The latch circuit 14 outputs the latched generated write address "7" as a signal J. In response to the high-level signal C, the counter 10 outputs a predetermined jump address "16" as a counter value "16" on the rising edge of the next write clock. Subsequently, the counter 10 increments the previously-outputted counter value in response to the leading edge of the write clock and outputs the result of increment therefrom. When the selector 11 receives a low-level signal B therein, the selector 11 outputs the output of the D-type flip-flop 13 as a generated write address. On the other hand, when the selector 11 receives a high-level signal B therein, the selector 11 outputs the output of the counter 10 as a generated write address. Next, the differential circuit 1 receives an input read address "6" and an input write address "0" therein. Further, the differential circuit 1 outputs a differential signal whose value is "6". At this time, the determination circuit 2 outputs a low-level decision signal because the value of the differential signal is greater than 2. Since the D-type flip-flop 12 outputs the decision signal delayed by one clock of the write train clock, the D-type flip-flop 12 outputs a low-level signal B delayed by one clock of the write clock after the decision signal has been rendered low in level. When the selector 11 receives the low-level signal B, the selector 11 outputs the output of the flip-flop 13 therefrom. Namely, the address generating circuit 3 outputs a signal obtained by delaying the input write address by one clock of the write clock therefrom as a generated write address. Since the value of an input read address does not coincide with the value "7", of the signal J during the second period, the address coincidence detecting circuit 15 outputs a low-level signal therefrom. Since the T-type flip-flop 18 outputs a low-level signal b therefrom, the selector 17 outputs the input read address therefrom. Namely, the address generating circuit 3 outputs the input read address during the second period.

An operation of the two-port memory during a third period will next be explained.

This period corresponds to a period during which the absolute value of the difference between the input read address and the input write address is greater than 2. The differential circuit 1 outputs a differential signal indicative of a value larger than 2. The determination circuit 2 outputs a low-level decision signal because the value of the differential signal is greater than or equal to 2. Since the D-type flip-flop 12 of the write address generating circuit outputs a low-level signal B during this period, the selector 11 outputs the output of the D-type flip-flop 13 therefrom. Namely, the address generating circuit 3 outputs a signal obtained by delaying the input write address by one clock of the write clock therefrom as a generated write address. When the address coincidence detecting circuit 15 of the read address generating circuit receives an input read address "7" therein, the address coincidence detecting circuit 15 outputs a high-level signal a therefrom. Thereafter, when the value of the input read address becomes a value other than "7", the address coincidence detecting circuit 15 outputs a low-level signal therefrom. In response to the high-level signal a outputted from the address coincidence detecting circuit 15, the counter 16 outputs a predetermined jump address (16 in this case) as a counter value 16 on the rising edge of the next read clock subsequent to the input of the high-level signal a to the counter 16. Afterwards, the counter 16 increments the previously-outputted counter value in response to the leading edge of the read clock and outputs the result of increment therefrom. In response to a high-level to low-level transition on the signal a, the T-type flip-flop 18 outputs a high-level signal b therefrom. The selector 17 outputs the output of the counter 16 while the high-level signal b is being inputted thereto.

An operation of the two-port memory during a fourth period will next be described.

The differential circuit 1 outputs a differential signal indicative of a value smaller than or equal to 2 during an interval between inputting an input read address "2" and an input write address "0" and inputting an input read address "5" and an input write address "7". While the differential circuit 1 is outputting the differential signal indicative of the value less than or equal to 2, the determination circuit 2 outputs a high-level decision signal therefrom. When the value of the differential signal outputted from the differential circuit 1 has firstly reached "2" during the fourth period, the NOR circuit 9 receives a low-level signal A and a low-level signal B therein and outputs a high-level signal C therefrom. In response to the high-level signal C, the latch circuit 14 latches the generated write address "7" inputted thereto at that time therein and outputs it therefrom as a signal J. After the high-level signal C has been inputted to the counter 10, the counter 10 outputs a predetermined jump address (16 in this case) as a counter value "16" on the rising edge of the next write clock. Subsequently, the counter 10 increments the previously-outputted counter value in response to the leading edge of the write clock and outputs the result of increment therefrom. While the selector 11 receives the low-level signal B therein, the selector 11 outputs the output of the D-type flip-flop 13 as a generated write address. On the other hand, when the selector 11 receives a high-level signal B therein, the selector 11 outputs the output of the counter 10 as a generated write address. Next, when the differential circuit 1 receives an input read address "6" and an input write address "0" therein, the differential circuit 1 outputs a differential signal whose value is "6". At this time, the determination circuit 2 outputs a low-level decision signal because the value of the differential signal is greater than 2. Since the D-type flip-flop 12 outputs the decision signal delayed by one clock of the write clock therefrom, the D-type flip-flop 12 outputs a low-level signal B delayed by one clock of the write clock after the decision signal has been rendered low in level. When the selector 11 receives the low-level signal B, the selector 11 outputs the output of the flip-flop 13. Since the T-type flip-flop 18 outputs a high-level signal b during the fourth period, the selector 17 outputs the output of the counter 16 therefrom.

An operation of the two-port memory during a fifth period will next be described.

This period corresponds to a period during which the absolute value of the difference between an input read address and an input write address is greater than 2. The differential circuit 1 outputs a differential signal indicative of a value larger than 2. The determination circuit 2 outputs a low-level decision signal because the value of the differential signal is greater than 2. Since the D-type flip-flop 12 of the write address generating circuit outputs a low-level signal B during this period, the selector 11 outputs the output of the D-type flip-flop 13 therefrom. Namely, the address generating circuit 3 outputs a signal obtained by delaying the input write address by one clock of the write clock therefrom as a generated write address. When the address coincidence detecting circuit 15 receives the value "7" of the input read address therein, the address coincidence detecting circuit 15 outputs a high-level signal a therefrom. Thereafter, when the value of the input read address becomes a value other than "7", the address coincidence detecting circuit 15 outputs a low-level signal therefrom. In response to the high-level signal a, the counter 16 outputs a predetermined jump address (16 in this case) as a counter value 16 on the rising edge of the next read clock subsequent to the input of the high-level signal a to the counter 16. Afterwards, the counter 16 increments the previously-outputted counter value in response to the leading edge of the read clock and outputs the result of increment therefrom. In response to a high-level to low-level transition on the signal a, the T-type flip-flop 18 outputs a low-level signal b therefrom. When the low-level signal b is inputted to the selector 17, the selector 17 outputs the input read address as a generated read address.

During the first through fifth periods, the write address decoder 5 decodes the generated write address and the read address decoder 4 decodes the generated read address. Further, the memory 7 stores the input data at the address corresponding to the output of the write address decoder 5 and outputs the data from the address corresponding to the output of the read address decoder 4.

As described above, the two-port memory according to the embodiment of the present invention supplies two addresses having a desired difference therebetween to a memory when the difference between an input read address and an input write address exceeds a predetermined value. Thus, since a collision between the addresses supplied to the memory can be avoided, a memory device can be prevented from malfunctioning. Since it is unnecessary to discuss address control upon use of the two-port memory, easy construction of a system is allowed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A memory device comprising:
   a differential circuit for outputting a signal having a value corresponding to a difference in value between an input read address signal and an input write address signal;
   a determination circuit for outputting a decision signal having a first level when the value of the signal outputted from said differential circuit falls within a predetermined value and outputting the decision signal having a second level when said value exceeds the predetermined value;
   an address generating circuit for receiving the input write address signal, the input read address signal and the decision signal therein and outputting generated write and read addresses having a difference in signal value therebetween exceeding at least the predetermined value regardless of the difference in value between the input write address signal and the input read address signal;
   a write address decoder for decoding the generated write address;
   a read address decoder for decoding the generated read address; and
   a memory for storing input data at an address corresponding to an output produced from said write address decoder and outputting output data from an address corresponding to an output produced from said read address decoder.

2. A memory device comprising:
   a differential circuit for outputting a signal having a value corresponding to a difference in value between an input read address signal and an input write address signal;
   a determination circuit for outputting a decision signal having a first level when the value of the signal outputted from said differential circuit falls within a predetermined value and outputting the decision signal having a second level when said value exceeds the predetermined value;
   an address generating circuit for receiving the input write address signal, the input read address signal and the decision signal therein, outputting a generated read address signal from a generated read address terminal, outputting a signal having a first value set with the difference in value between the input write address signal and the signal having the first value exceeded at least the predetermined value, from a generated write address terminal in response to the decision signal having the first level, and outputting a signal corresponding to the input write address signal from the generated write address terminal in response to the decision signal having the second level;
   a write address decoder for decoding the output obtained from the generated write address terminal;
   a read address decoder for decoding the output obtained from the generated read address terminal; and
   a memory for storing input data at an address corresponding to an output produced from said write address decoder and outputting input data stored at an address corresponding to an output produced from said read address decoder.

3. A memory device according to claim 2, wherein the signal corresponding to the input write address signal outputted from the generated write address terminal is a signal obtained by delaying the input write address signal.

4. A memory device according to claim 2 or 3, wherein said address generating circuit is provided which holds a value of the signal corresponding to the input write address signal outputted from the generated write address terminal immediately before said address generating circuit outputs, in response to the decision signal having the first level, the signal having a first value set with the difference in value between the input write address signal and the signal having the first value exceeded at least the predetermined value, and which outputs the signal having the first value from the generated read address terminal as the generated read address in response to the coincidence between the value of the input read address signal and the held value of signal corresponding to the input write address signal.

5. A method of controlling a memory device, comprising the steps of:

supplying a signal corresponding to an input read address signal and a signal corresponding to an input write address signal to a memory in response to the time when the difference in value between the input read address signal and the input write address signal different in cycle from the input read address signal exceeds a predetermined value; and supplying a generated read address and a generated write address used for the reading and writing of data from and to said memory and having a difference in signal value therebetween exceeding at least the predetermined value, to said memory in response to the time when the difference falls within the predetermined value.

* * * * *